(12) United States Patent
Chew

(10) Patent No.: US 10,872,834 B2
(45) Date of Patent: *Dec. 22, 2020

(54) INTEGRATED CIRCUIT STRUCTURES WITH EXTENDED CONDUCTIVE PATHWAYS

(71) Applicant: Intel Corporation, Santa Clara, CA (US)

(72) Inventor: Yen Hsiang Chew, Georgetown (MY)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/727,584

(22) Filed: Dec. 26, 2019

(65) Prior Publication Data

US 2020/0135603 A1 Apr. 30, 2020

Related U.S. Application Data

(63) Continuation of application No. 16/086,712, filed as application No. PCT/US2016/029692 on Apr. 28, 2016, now Pat. No. 10,553,515.

(51) Int. Cl.
*H01L 21/00* (2006.01)
*H01L 23/31* (2006.01)
(Continued)

(52) U.S. Cl.
CPC .......... *H01L 23/3128* (2013.01); *H01L 23/48* (2013.01); *H01L 23/488* (2013.01); *H01L 24/16* (2013.01); *H01L 25/0652* (2013.01); *H01L 25/105* (2013.01); *H01L 25/50* (2013.01); *H01L 24/13* (2013.01); *H01L 2224/13101* (2013.01); *H01L 2224/16225* (2013.01); *H01L 2224/73204* (2013.01); *H01L 2224/81894* (2013.01); *H01L 2225/06513* (2013.01); *H01L 2225/06548* (2013.01); *H01L 2225/06572* (2013.01); *H01L 2924/1304* (2013.01);
(Continued)

(58) Field of Classification Search
CPC ...... H01L 23/3128; H01L 24/16; H01L 25/50
See application file for complete search history.

(56) References Cited

U.S. PATENT DOCUMENTS 7,842,541 B1 11/2010 Rusli et al.
8,810,025 B2 8/2014 Liu et al.
(Continued)

FOREIGN PATENT DOCUMENTS

WO 2016048347 A1 3/2016

OTHER PUBLICATIONS

International Search Report and Written Opinion issued in PCT Application No. PCT/US2016/029692 dated Dec. 8, 2016; 8 pages.
(Continued)

*Primary Examiner* — Laura M Menz
(74) *Attorney, Agent, or Firm* — Patent Capital Group

(57) ABSTRACT

Integrated circuit (IC) structures with extended conductive pathways, as well as related structures, devices, and methods, are disclosed herein. For example, in some embodiments, an IC structure may include a die having a device side and an opposing back side; a mold compound disposed at the back side; and a conductive pathway extending into the die from the back side and extending into the mold compound from the back side.

20 Claims, 11 Drawing Sheets

(51) Int. Cl.
*H01L 23/488* (2006.01)
*H01L 25/00* (2006.01)
*H01L 25/10* (2006.01)
*H01L 25/065* (2006.01)
*H01L 23/48* (2006.01)
*H01L 23/00* (2006.01)

(52) U.S. Cl.
CPC ............. *H01L 2924/13091* (2013.01); *H01L 2924/1433* (2013.01); *H01L 2924/15311* (2013.01)

(56) References Cited

U.S. PATENT DOCUMENTS

| | | | |
|---|---|---|---|
| 8,853,830 B2 | 10/2014 | Chang et al. | |
| 9,252,077 B2* | 2/2016 | Molzer | H01L 23/66 |
| 10,128,593 B1 | 11/2018 | Hejase et al. | |
| 2003/0218237 A1 | 11/2003 | Hall et al. | |
| 2008/0079139 A1 | 4/2008 | Ye et al. | |
| 2011/0215464 A1* | 9/2011 | Guzek | H01L 21/56 257/737 |
| 2011/0298125 A1 | 12/2011 | Ko | |
| 2011/0316147 A1 | 12/2011 | Shih et al. | |
| 2012/0153445 A1 | 6/2012 | Son et al. | |
| 2014/0247195 A1 | 9/2014 | Yen | |
| 2014/0332975 A1 | 11/2014 | Raorane et al. | |
| 2016/0013153 A1* | 1/2016 | Meyer | H01L 24/82 257/737 |
| 2016/0372404 A1* | 12/2016 | Sun | H01L 21/561 |
| 2017/0271175 A1 | 9/2017 | Healy et al. | |
| 2018/0061741 A1 | 3/2018 | Beyne | |
| 2019/0109063 A1* | 4/2019 | Chew | H01L 25/105 |
| 2019/0123081 A1 | 4/2019 | Chang et al. | |
| 2019/0189564 A1* | 6/2019 | Guzek | H01L 21/56 |

OTHER PUBLICATIONS

USPTO Notice of Allowance issued in U.S. Appl. No. 16/086,712 dated Oct. 8, 2019; 14 pages.

* cited by examiner

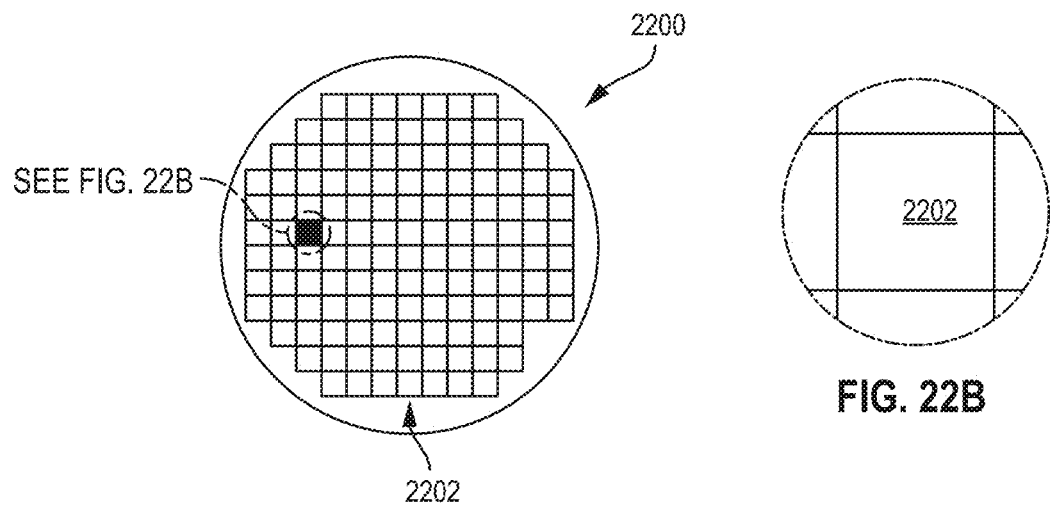
FIG. 22A
FIG. 22B
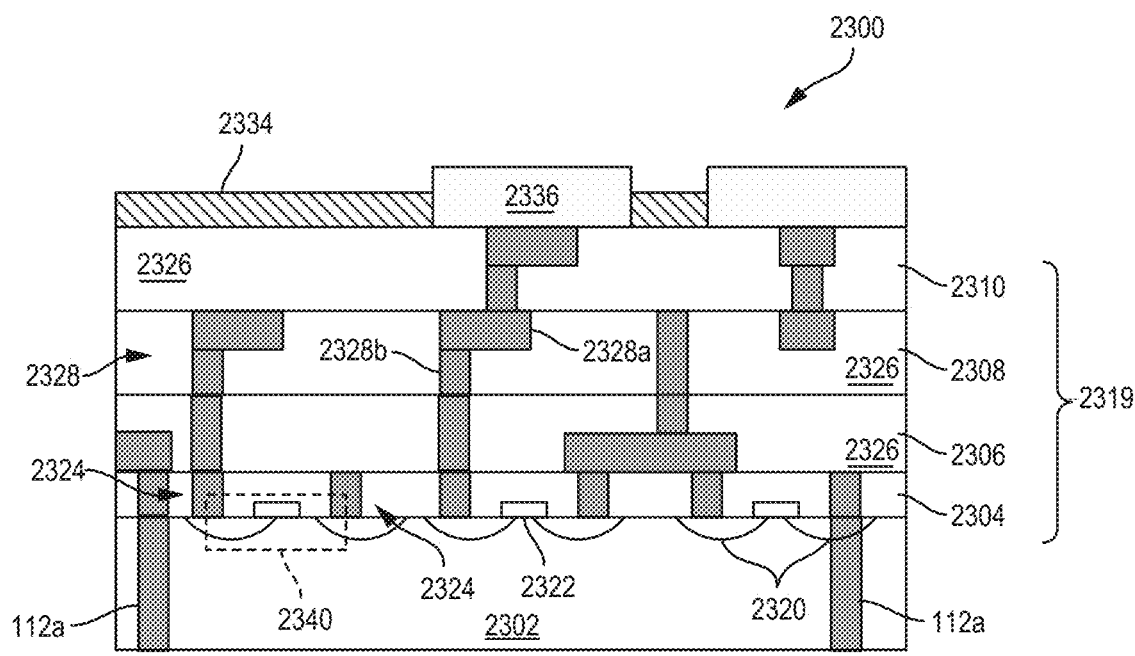
FIG. 23

INTEGRATED CIRCUIT STRUCTURES WITH EXTENDED CONDUCTIVE PATHWAYS

CROSS-REFERENCE TO RELATED APPLICATIONS

This application is a continuation of U.S. application Ser. No. 16/086,712, filed Sep. 20, 2018 and titled "INTEGRATED CIRCUIT STRUCTURES WITH EXTENDED CONDUCTIVE PATHWAYS," which is a national phase entry of PCT International Application No. PCT/US2016/29692, filed Apr. 28, 2016, entitled "INTEGRATED CIRCUIT STRUCTURES WITH EXTENDED CONDUCTIVE PATHWAYS." The disclosures of these prior applications are incorporated by reference herein in their entireties.

BACKGROUND

As electronic devices become smaller, reducing the footprint of these devices becomes important. One approach to reducing device footprints includes stacking multiple electronic packages in a package-on-package arrangement.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 22A and 22B are top views of a wafer and dies that may be used with any of the embodiments of the double-sided IC structures disclosed herein.

FIG. 23 is a cross-sectional side view of an IC device that may be used with any of the embodiments of the double-sided IC structures disclosed herein.

DETAILED DESCRIPTION

Figure 1:
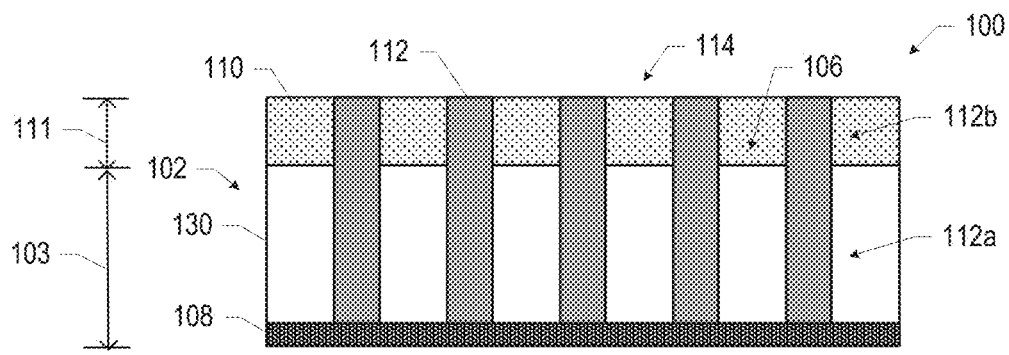
FIG. 1 is a cross-sectional side view of a double-sided integrated circuit (IC) structure, in accordance with various embodiments.

Integrated circuit (IC) structures with extended conductive pathways, as well as related structures, devices, and methods, are disclosed herein. For example, in some embodiments, an IC structure may include a die having a device side and an opposing back side, a mold compound disposed at the back side, and a conductive pathway extending into the die from the back side and extending into the mold compound from the back side.

Conventional package-on-package architectures have been constrained in the flexibility with which topside interconnects can be arranged. For example, some conventional package-on-package arrangements include a bottom die "sandwich" between top and bottom package substrates; the bottom die is electrically coupled to a bottom package substrate, and solder balls on the top side of the bottom package substrate electrically couple the bottom package substrate to the top package substrate. A top die may be disposed on the top package substrate. In such structures, solder pads are fabricated on the upper side of the bottom package substrate at the "sides" of the bottom die, but no interconnects between the bottom die and the top die can be positioned directly above the bottom die. Additionally, because the bottom package substrate and the top package substrate are separated by the bottom die, only large interconnects may be used to couple the top and bottom package substrate (e.g., large solder balls), and thus other interconnect technologies (such as micro bumps or surface activated bonding) may not be used.

In another conventional arrangement, a middle die may be disposed between a top die and a bottom die without intervening package substrates, and the middle die may include through silicon vias exposed on the back and top sides of the middle die. The stack of three dies may be disposed on a package substrate. Signals and power may be routed between the top and bottom dies through the middle die, but no interconnects may be made on the "sides" of the stack of dies (e.g., from the area of the package substrate that is outside the footprint of the first die). Additionally, this arrangement typically requires the use of micro bumps or surface activated bonding to couple adjacent dies in the stack, and thus the use of more conventional solder ball technology is not supported.

Various ones of the embodiments disclosed herein may provide extended conductive pathways (e.g., extended through silicon vias), combined with conductive pads and routing on a mold compound, to achieve customizable topside package interconnects. In particular, some of the embodiments disclosed herein provide a molded semiconductor package assembly with external interconnects (e.g., contact pads) that can be placed anywhere on the top side of the mold compound. One or more additional packages may be stacked on top of the exposed interconnects to form a package-on-package assembly, or one or more additional dies may be coupled to the exposed interconnects using surface activated bonding. Thus, various embodiments disclosed herein may provide a package whose entire topside area may be used for conductive routing and contact pad placement, increasing the total number of pads or external interconnects that can be placed on top of a package assembly relative to conventional approaches. Moreover, the size, shape, separation, and placement of the contact pads and traces on the top side of the package may be customized to match the location, size, shape, impedance, and pitch of the die or other electronic component stacked on the package, a design flexibility not achievable with conventional approaches.

Also disclosed herein are a number of methods for manufacturing double-sided packages. For example, in some embodiments, a through silicon via (TSV) formed in the back side of a silicon die may be extended beyond the exposed back side of the silicon wafer during wafer processing and handling. After die attachment, the package assembly may be molded so that the mold compound covers the exposed "extended TSV." The mold compound may then be thinned to form a flat surface with the exposed extended TSV on the mold compound, and lithography may be performed on the thinned mold compound for metal routes and metal pads that are electrically coupled to the exposed extended TSV on the mold compound. An external module may then be connected on the formed metal pads in a package-on-package or stacked die multi-chip package assembly, for example. The result is a set of electrically connected extended TSVs on the back side of a silicon die that can provide a set of customizable metal routes and external metal pads on the top side of a mold package assembly.

In the following detailed description, reference is made to the accompanying drawings that form a part hereof wherein like numerals designate like parts throughout, and in which is shown, by way of illustration, embodiments that may be practiced. It is to be understood that other embodiments may be utilized and structural or logical changes may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. As used herein, a double-sided IC structure may refer to an IC structure that has interconnects on at least two opposing sides.

FIG. 1 is a cross-sectional side view of a double-sided integrated circuit (IC) structure 100 (also referred to herein as a "structure 100"), in accordance with various embodiments. The structure 100 may include a die 102 having a device side 104 and an opposing back side 106. As known in the art, circuitry 108 (including, e.g., transistor and other active devices, passive devices, and metallization layers) may be disposed at the device side 104 of the die 102. The circuitry 108 may be formed in and/or on an IC substrate 130. In some embodiments, the IC substrate 130 may be a semiconductor substrate, such as a portion of a silicon wafer, but any suitable IC substrate 130 may be used. A mold compound 110 may be disposed at the back side 106 of the die 102, and at least one conductive pathway 112 may extend into the die 102 from the back side 106 and extend into the mold compound 110 from the back side 106. Multiple such conductive pathways 112 are illustrated in FIG. 1.

The conductive pathways 112 may extend to the circuitry 108, and may be in electrical contact with one or more elements in the circuitry 108 (e.g., in electrical contact with a device or interconnect, as discussed below with reference to FIG. 23). The mold compound 110 may have a surface 114 spaced away from the back side 106 of the die 102, and the conductive pathways 112 may extend to the surface 114 so that the conductive pathways 112 are at least partially exposed at the surface 114. Thus, the structure 100 may provide interconnect opportunities at the surface 114 (via the exposed conductive pathways 112) and at the device side 104 of the die 102 (e.g., via exposed contact pads, as known in the art and as discussed below with reference to FIG. 23).

The thickness 111 of the mold compound 110 at the back side 106 of the die 102 may take any suitable value. The thickness 111 may depend on the coefficient of thermal expansion (CTE) of the mold compound 110; a lower CTE may enable a lesser thickness 111 without risking thermal mismatch or cracking between the conductive pathways 112 and a package interconnect layer 116 at the surface 114 (see, e.g., FIG. 2), while a higher CTE may make a greater thickness 111 more desirable (e.g., to provide more material to absorb heat to minimize thermal failures). For example, in some embodiments, the thickness 111 may be greater than or equal to the thickness 103 of the die 102. In other embodiments, the thickness 111 may be less than the thickness 103 of the die 102. In some embodiments, the thickness 111 may be 0.2 millimeters or greater (e.g., 0.3-0.5 millimeters).

The mold compound 110 may be formed of any suitable material, such as a polymer compound, a poly-resin mold compound, an elastomer mold compound, or any other suitable material. Other examples of mold compounds that may be included in the mold compound 110 may include plastic materials, thermosetting polymers, silicon composites, glass, epoxy resins, or fiberglass epoxy resins. The mold compound 110 may also include some filler material. For example, the mold compound 110 may include an epoxy resin with tiny grains (e.g., on the order of a micrometer) of fused silica or amorphous silicon dioxide. In some embodiments, the mold compound 110 may be a flexible material (e.g., to enable some wearable device applications). In some embodiments, the mold compound 110 may be a heat conductive (but electrically insulative) material that may allow the mold compound 110 to function as a heat spreader and spread heat generated by the die 102 to other areas of the structure 100 (or a larger package or assembly in which the structure 100 is included).

The conductive pathways 112 may be formed of one or more conductive materials, such as a metal (e.g., copper). Although the conductive pathways 112 illustrated in FIG. 1 are shown as having substantially parallel sidewalls, the conductive pathways 112 may have any profile (e.g., as dictated by the manufacturing operations used to form the conductive pathways 112). For example, the first portion 112a and/or the second portion 112b may be tapered. In some embodiments, the width (e.g., the diameter) of the first portion 112a may be different from the width of the second portion 112b. For example, the second portion 112b may be wider (e.g., have a larger diameter) than the first portion 112a to give the second portion 112b additional mechanical robustness to protect the second portion 12b during photoresist removal and/or molding, as discussed below with reference to FIGS. 16 and 17. Although "enlarged" relative to the first portions 112a, adjacent second portions 112b may remain electrically isolated from each other.

Figure 2:
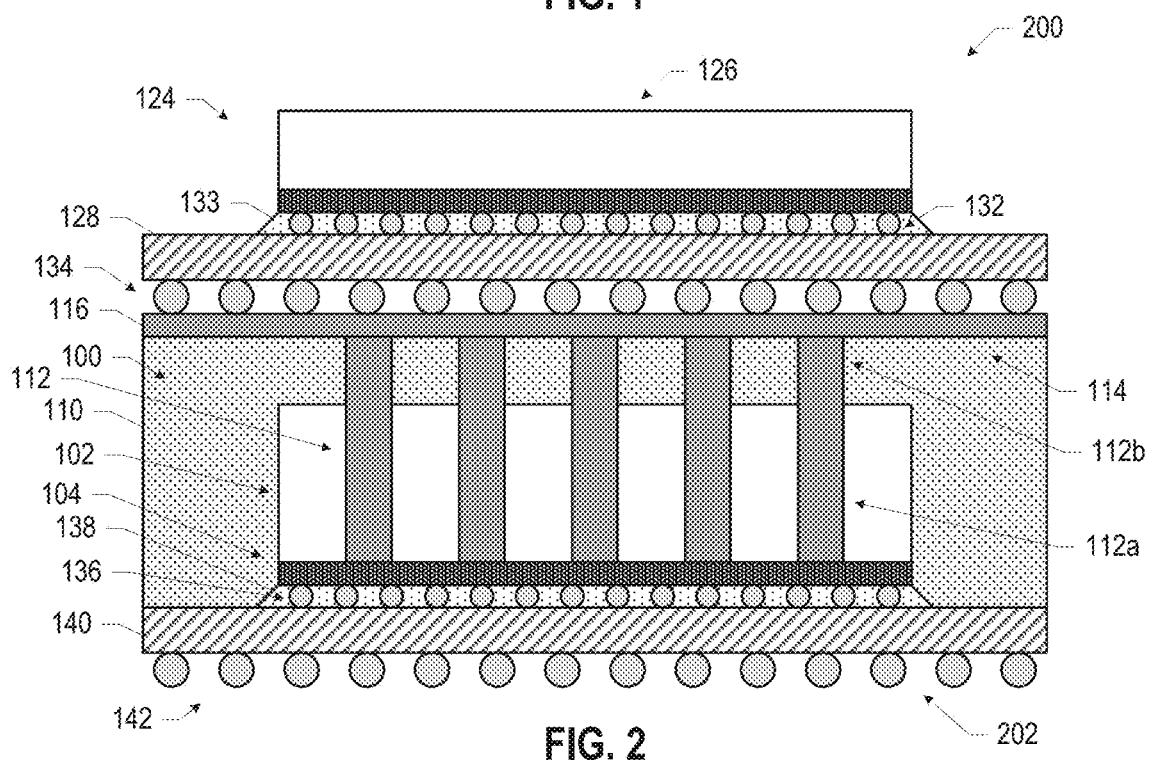
FIG. 2 is a cross-sectional side view of a stacked IC structure including the double-sided IC structure of FIG. 1 in a double-sided package, in accordance with various embodiments.

FIG. 2 is a cross-sectional side view of a stacked IC structure 200 including the double-sided IC structure 100 of FIG. 1 in a double-sided package 202, in accordance with various embodiments. In particular, in the double-sided package 202, the device side 104 of the die 102 may be coupled to a package substrate 140 via first-level interconnects (FLI) 136. The package substrate 140 may include electrical pathways (not shown) to route signals or power between the FLI 136 and the second-level interconnects (SLI) 142, as known in the art. The mold compound 110 may extend around the sides of the die 102, as illustrated in FIG. 2, and in some embodiments, the area between the die 102 and the package substrate 140 may be filled with underfill 138.

The double-sided package 202 may also include a package interconnect layer 116 (in electrical contact with the conductive pathways 112) disposed on the surface 114 of the mold compound 110. The package interconnect layer 116 may provide contact pads for electrical connections with an electronic component 124 disposed on the package interconnect layer 116 (discussed below), and may also contain routing features to redistribute electrical signals within the package interconnect layer 116. In some embodiments, signals and/or power may be routed from the SLI 142 to the package interconnect layer 116 via the FLI 136 and the conductive pathways 112. In this manner, signals and/or power may be communicated between a circuit board on which the double-sided package 202 is disposed (not shown) and the package interconnect layer 116. In some embodiments, signals and/or power may be routed from the device side 104 of the die 102 to the package interconnect layer 116 via the conductive pathways 112. In this manner, signals and/or power may be communicated between the die 102 and the package interconnect layer 116. The double-sided package 202 may thus provide interconnects at the SLI 142 of the package substrate 140, as well as at the package interconnect layer 116 on the other side of the double-sided package 202.

Figure 3:
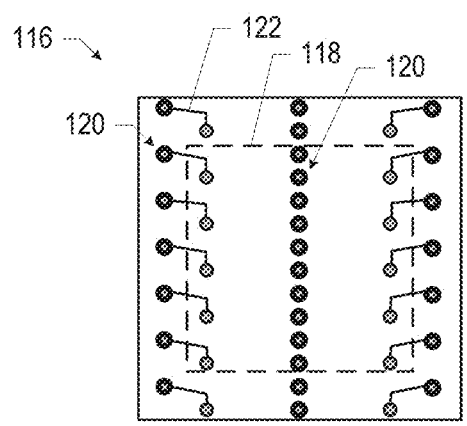
FIG. 3 is an example top view of the double-sided package of FIG. 2, in accordance with various embodiments.

As noted above, the package interconnect layer 116 may include contact pads for making electrical connections with an electronic component 124 disposed on the package interconnect layer 116, and electrical pathways for routing signals within the package interconnect layer 116. FIG. 3 is an example top view of the double-sided package of FIG. 2, showing the package interconnect layer 116 in accordance with various embodiments. The package interconnect layer 116 may include contact pads 120 for making electrical contact with the electronic component 124 and traces 122 for routing signals in the package interconnect layer 116. In some embodiments, one or more contact pads 120 of the package interconnect layer 116 may be located within the footprint 118 of the die 102 and/or outside of the footprint 118 of the die 102. For example, the embodiment of FIG. 3 includes contact pads 120 within the footprint 118 and outside of the footprint 118.

The stacked IC structure 200 may also include an electronic component 124 disposed on the package interconnect layer 116 and in conductive contact with one or more contact pads 120 of the package interconnect layer 116. In the embodiment illustrated in FIG. 2, the electronic component 124 includes a die 126 coupled to a package substrate 128 via FLI 132 (with the FLI 132 encased by underfill 133). SLI 134 couple the package substrate 128 to the contact pads 120 of the package interconnect layer 116. In some embodiments, signals and/or power may be routed from the SLI 142 to the electronic component 124 via the conductive pathways 112 and the package interconnect layer 116. In this manner, signals and/or power may be communicated between a circuit board on which the double-sided package 202 is disposed (not shown) and the electronic component 124. In some embodiments, signals and/or power may be routed from the device side 104 of the die 102 to the electronic component 124 via the conductive pathways 112 and the package interconnect layer 116. In this manner, signals and/or power may be communicated between the die 102 and the electronic component 124. In some embodiments, a single electronic component 124 may be in contact with contact pads 120 within the footprint 118 and outside of the footprint 118; while in other embodiments, a single electronic component 124 may be in contact with contact pads 120 within the footprint 118 (and not outside of the footprint 118), or vice versa.

Figure 4:
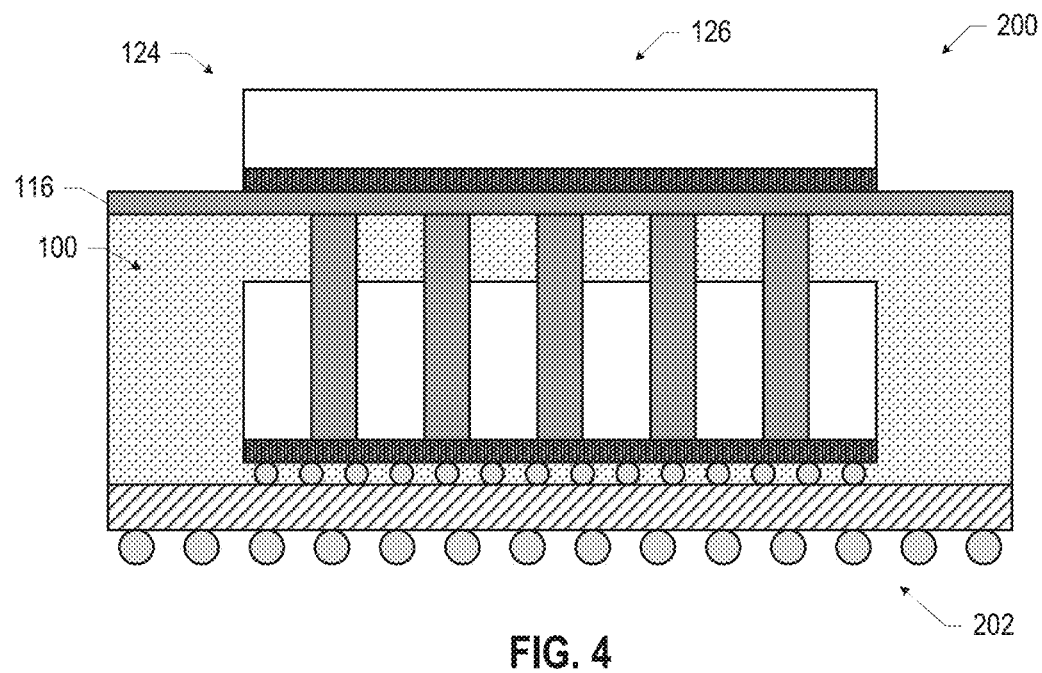
FIGS. 4-6 are cross-sectional side views of other stacked IC structures including the double-sided IC structure of FIG. 1 in a double-sided package, in accordance with various embodiments.

The electronic component 124 may take any suitable form, such as a packaged die, a display, a sensor, a memory device, any other input or output device, any other processing or storage device, or any combination of such devices. For example, electronic component 124 may be a wearable display that may be, for example, coupled to the package interconnect layer 116 via surface activated bonding. In some embodiments, the electronic component 124 may itself include a double-sided IC structure 100 (e.g., included in a double-sided package 202), and may have additional electronic components 124 stacked thereon (not shown). The electronic component 124 may be coupled to the package interconnect layer 116 using any suitable mechanism. For example, FIG. 2 illustrates the use of solder balls or bumps as the SLI 134. The pitch of the SLI 134 may be 30 microns or greater (e.g., 50 microns) in some embodiments, enabling the use of interconnects that are larger than conventionally achievable. In the embodiment of FIG. 4, the electronic component 124 may include a die 126 that is coupled to the package interconnect layer 116 via surface activated bonding.

In some embodiments, power and ground pads of the double-sided package 202 may be routed to match the locations of the power and ground pads of the electronic component 124. Such an arrangement may not be achievable by conventional approaches, in which conductive pad placement may be confined to areas outside the footprint 118 of the die 102. As noted above, the spacing, size, and shape of each contact pad 120 may be adjusted based on the solder ball pitch requirements of the electronic component 124. For example, the contact pads 120 may support a large enough solder ball pitch to enable a preassembled memory package module to be used as the electronic component 124. Such an arrangement may not be achievable using conventional approaches that are limited to using micro bumps to connect top and bottom dies.

In some embodiments, the electronic component 124 may be or include a radio chip. In such embodiments, the size, traces 122, placement, and pitch of the contact pads 120 may be designed to match the impedance of the radio chip in order to achieve improved performance relative to a conventional approach in which the layout of the contact pads 120 and the traces 122 is not as flexible.

Figure 5:
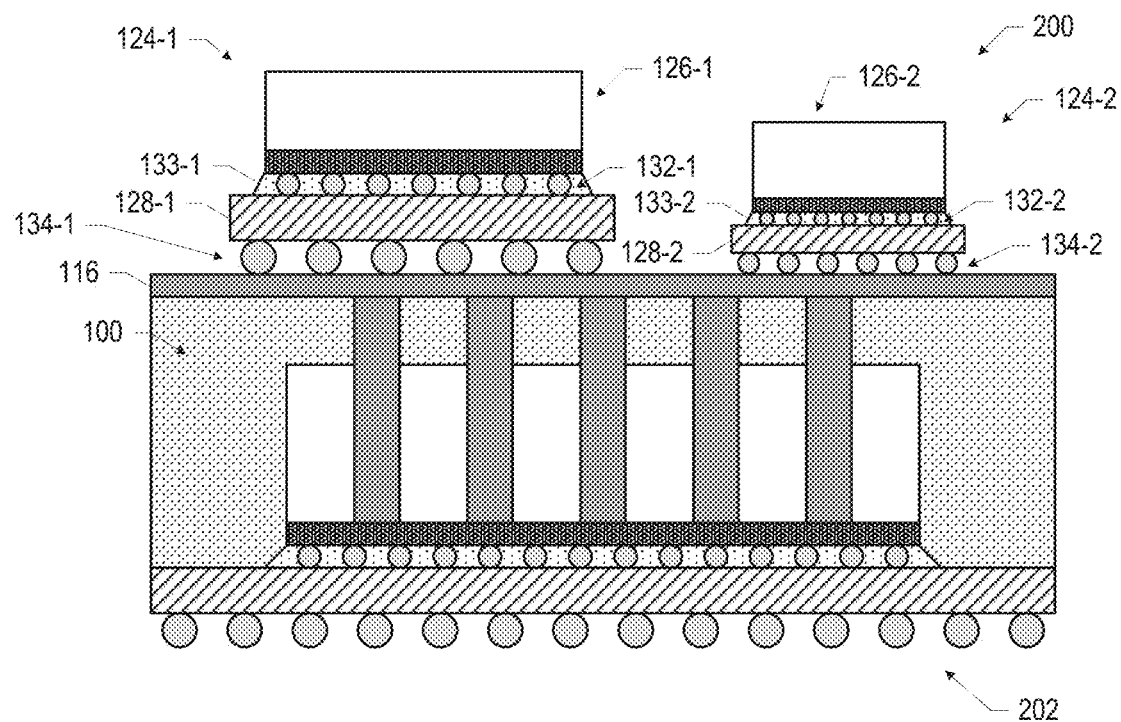

In some embodiments, multiple electronic components may be coupled to the package interconnect layer 116. For example, FIG. 5 illustrates an embodiment in which two electronic components, 124-1 and 124-2, are coupled to the package interconnect layer 116. Each electronic component 124 of FIG. 5 includes a die 126 coupled to a package substrate 128 via FLI 132 (optionally surrounded by underfill 133) and SLI 134. As shown in FIG. 5, the pitch of the SLI 134-1 of the electronic component 124-1 may be different from the pitch of the SLI 134-2 of the electronic component 124-2 (in particular, in FIG. 5, the pitch of the SL 134-2 may be less than the pitch of the SLI 134-1). The ability of the package interconnect layer 116 to be patterned with contact pads 120 and traces 122 in any desired arrangement may enable the double-sided package 202 to stack with multiple electronic components 124 having different pitches, a significant area of design flexibility not afforded by conventional approaches.

Figure 6:
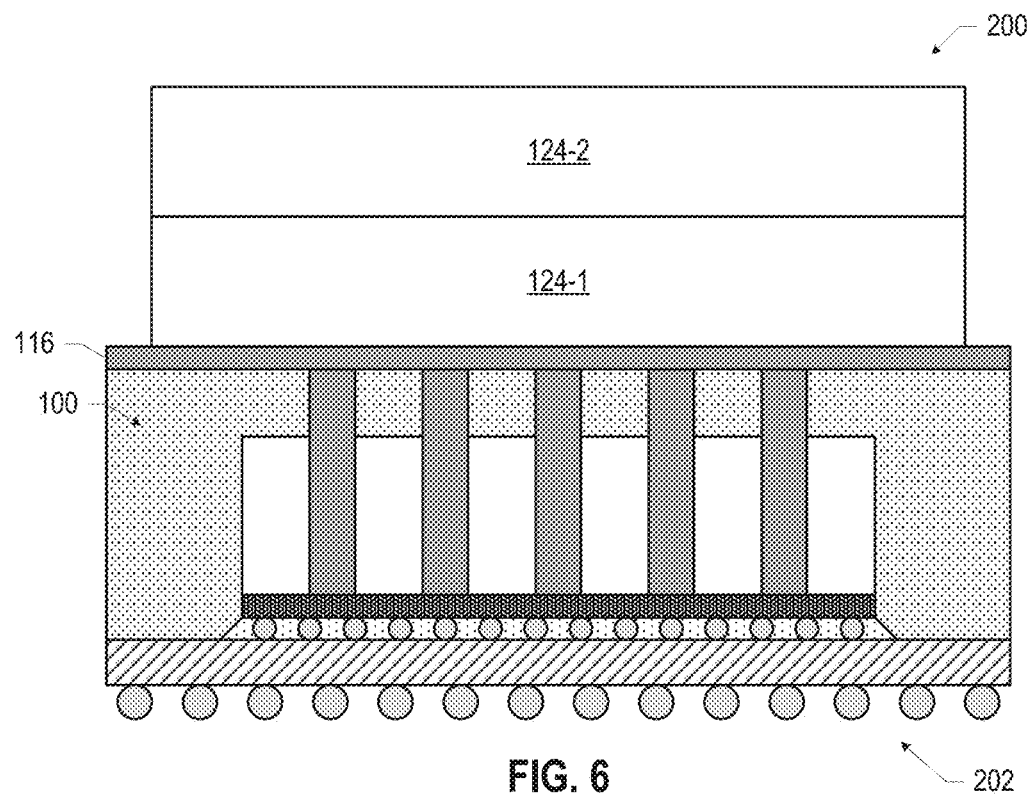

As noted above, in some embodiments, an electronic component 124 stacked on top of a double-sided package 202 may include a double-sided IC structure 100, and thus may support the stacking of additional electronic components 124 using the mechanisms described above. In other embodiments, multiple electronic components 124 may be stacked on the double-sided package 202, and these multiple electronic components 124 may be coupled to each other and to the double-sided package 202 using other package-on-package techniques. For example, the electronic components 124-1 and 124-2 of FIG. 6 may be coupled together using any of the conventional approaches discussed above.

FIGS. 7-20 illustrate cross-sectional views of various stages in an example process for manufacturing the stacked IC structure 200 of FIG. 2, in accordance with various embodiments. FIGS. 7-13 may represent the parallel manufacture of multiple assemblies on a single IC substrate that are separated during manufacture (as discussed below with reference to FIG. 14) before subsequent operations. Although particular techniques are discussed below with reference to FIGS. 7-20, any suitable methods may be used to manufacture embodiments of the double-sided IC structure 100, the double-sided package 202, or the stacked IC structure 200. Additionally, the techniques described below with reference to FIGS. 7-20 may be applied analogously to manufacture other stacked IC structures 200 disclosed herein (e.g., the stacked IC structures 200 of FIGS. 4-6).

Figure 7:
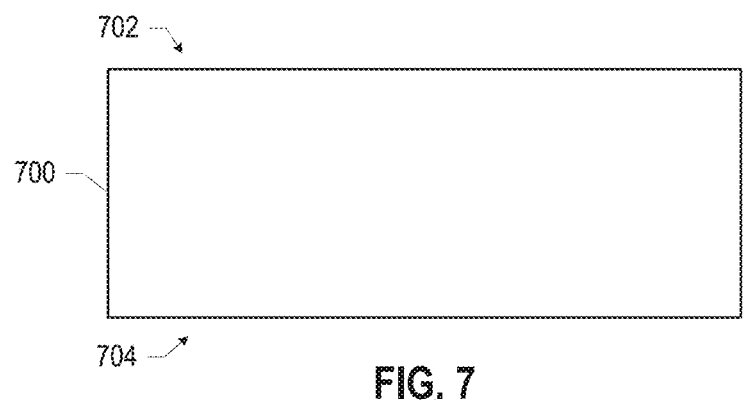
FIGS. 7-20 illustrate cross-sectional views of various stages in an example process for manufacturing the stacked IC structure of FIG. 2, in accordance with various embodiments.

FIG. 7 illustrates an IC substrate 700 having a front side 704 and a back side 702. The IC substrate 700 may take the form of any of the IC substrates discussed above with reference to the IC substrate 130. For example, in some embodiments, the IC substrate 700 may be a semiconductor substrate, such as a silicon wafer or a wafer of another semiconductor material.

Figure 8:
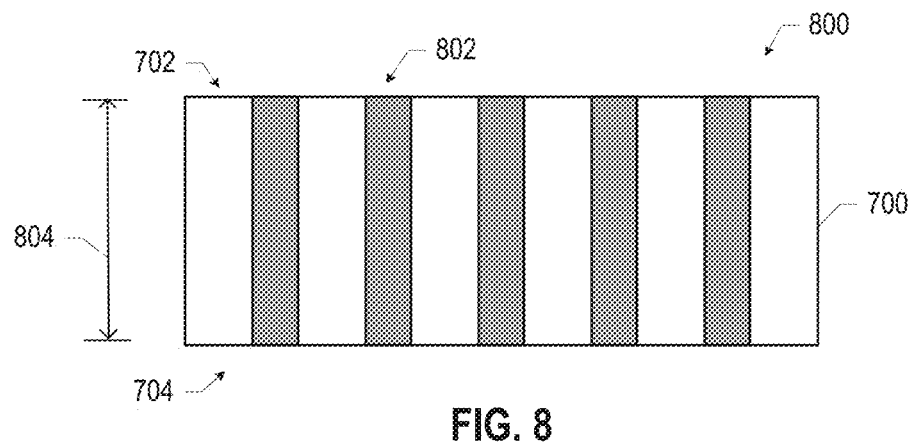

FIG. 8 illustrates an assembly 800 subsequent to forming conductive pathways 802 between the back side 702 and the front side 704 of the IC substrate 700. In some embodiments, these conductive pathways 802 may be formed by drilling (e.g., laser drilling) through the IC substrate 700 to form openings that may then be filled with a conductive material (e.g., copper). In embodiments in which the IC substrate 700 is formed of silicon, the conductive pathways 802 may be through silicon vias (TSVs), and may be formed using any suitable TSV formation techniques. The conductive pathways 802 may take the form of any of the first portions 112a of the conductive pathways 112 discussed above. The assembly 800 may have a thickness 804, corresponding to the thickness of the IC substrate 700.

Figure 9:
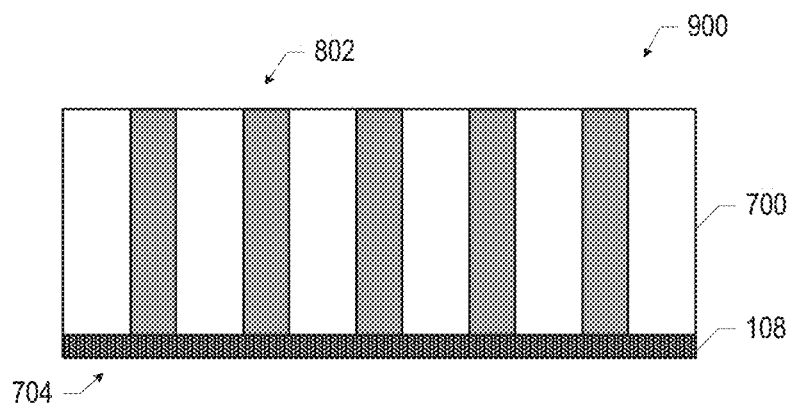

FIG. 9 illustrates an assembly 900 subsequent to forming circuitry 108 at the front side 704 of the IC substrate 700 of the assembly 800. The circuitry 108 may include active devices, passive devices, metallization layers, and any other suitable components as known in the art and as discussed above with reference to FIG. 1 and below with reference to FIG. 23. The circuitry 108 may be in conductive contact with one or more of the conductive pathways 802. In some embodiments, active and/or passive devices of the circuitry 108 may be in contact with one or more of the conductive pathways 802. In some embodiments, the conductive pathways 802 may be in contact with electrical routing pathways in the circuitry 108 so as to route signals from the front side 704 to the back side 702 without contacting any active or passive devices in the circuitry 108.

Figure 10:
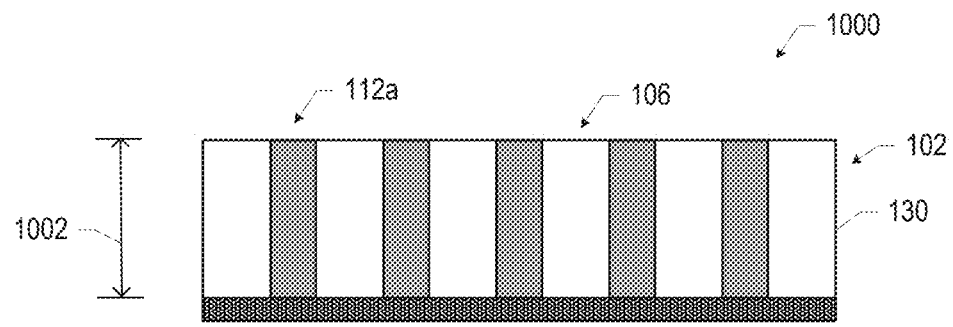

FIG. 10 illustrates an assembly 1000 subsequent to thinning the IC substrate 700 of the assembly 900 to a thickness 1002 less than the thickness 804. Thinning operations may include chemical and/or mechanical polishing (e.g., chemical mechanical polishing (CMP)) to form a new back side 106 of the IC substrate 700. The thickness 1002 may take any suitable value (e.g., in some applications, 200 to 400 microns). The assembly 1000 may provide the die 102 discussed above with reference to FIG. 1. In particular, the resulting thinned IC substrate 700 may provide the IC substrate 130 discussed above with reference to FIG. 1, and the resulting thinned conductive pathways 802 may provide the first portions 112a of the conductive pathways 112 discussed above with reference to FIG. 1.

Figure 11:
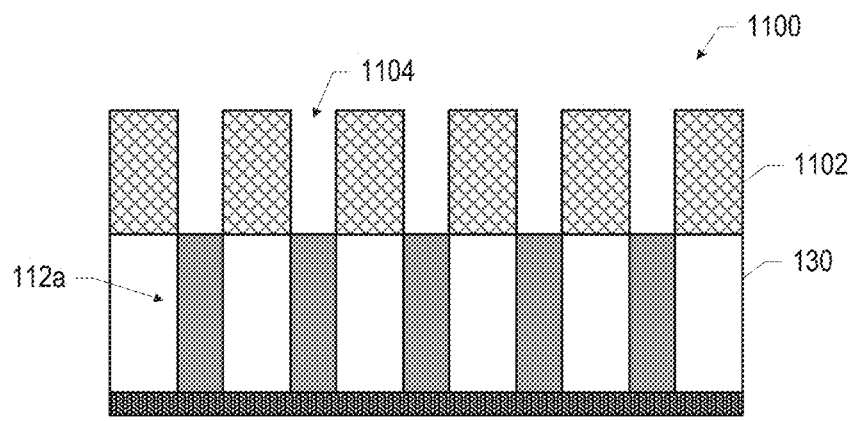

FIG. 11 illustrates an assembly 1100 subsequent to providing and patterning a photoresist 1102 on the back side 106 of the IC substrate 130. The photoresist 1102 may be patterned with openings 1104 that align with the first portions 112a. As discussed above, in some embodiments, the openings 1104 may have a width (e.g., a diameter) different than a corresponding width of the first portions 112a. For example, the width of the openings 1104 may be greater than the width of the first portions 112a. This may result in conductive pathways 112 with second portions 112b that are correspondingly wider than the first portions 112a, in accordance with the operations discussed below.

Figure 12:
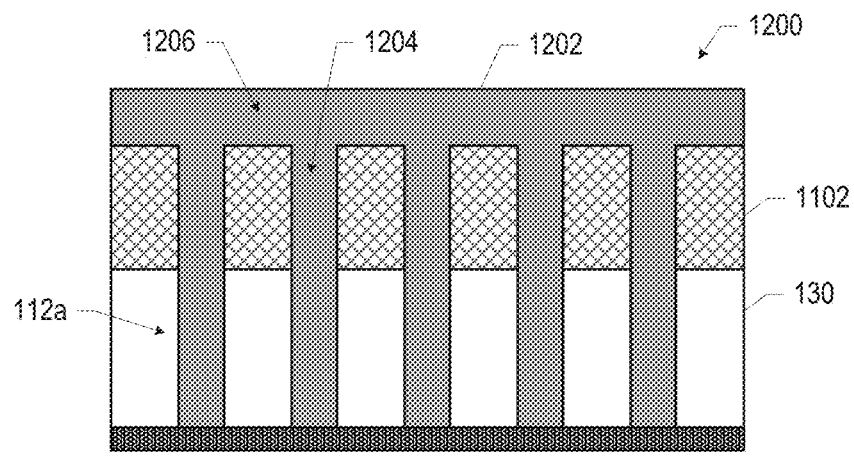

FIG. 12 illustrates an assembly 1200 subsequent to providing a conductive material 1202 to the assembly 1100. The conductive material 1202 may include conductive material 1204 that fills the openings 1104, and excess material 1206 that extends beyond the openings 1104 in the photoresist 1102.

Figure 13:
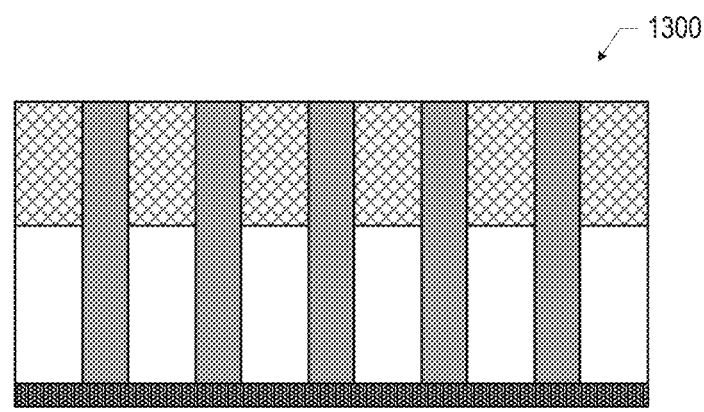

FIG. 13 illustrates an assembly 1300 subsequent to thinning the assembly 1200 to remove the excess material 1206. Thinning operations may include chemical and/or mechanical polishing (e.g., CMP). In some embodiments, some of the photoresist 1102 (and some of the conductive material 1202 filling the openings 1104) may also be removed during the removal of the excess material 1206.

Figure 14:
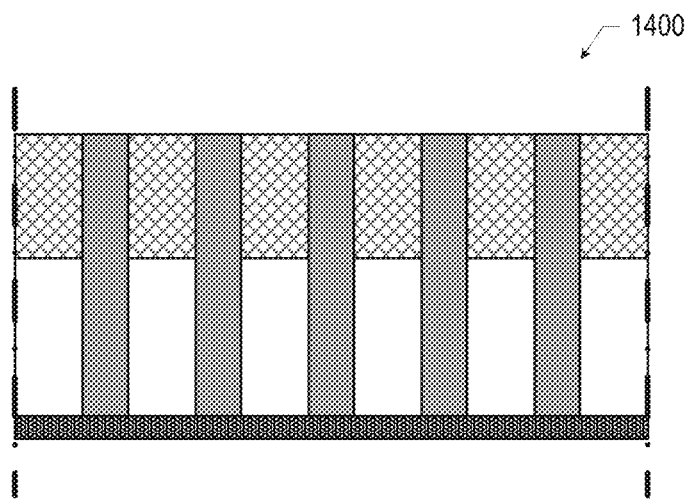

FIG. 14 illustrates an assembly 1400 subsequent to singulating different ones of the assembly 1300 from each other (using, e.g., a diamond-tipped saw blade). As noted above, the operations of FIGS. 7-13 may be performed substantially in parallel to manufacture multiple ones of the corresponding assemblies on a single IC substrate 700; these assemblies may be separated from each other, as illustrated by FIG. 14, before commencing subsequent operations. In some embodiments, testing of the elements of the assembly 1400 (e.g., performance testing, continuity testing, mechanical testing, etc.) may occur after singulation, and/or the testing may occur before singulation.

Figure 15:
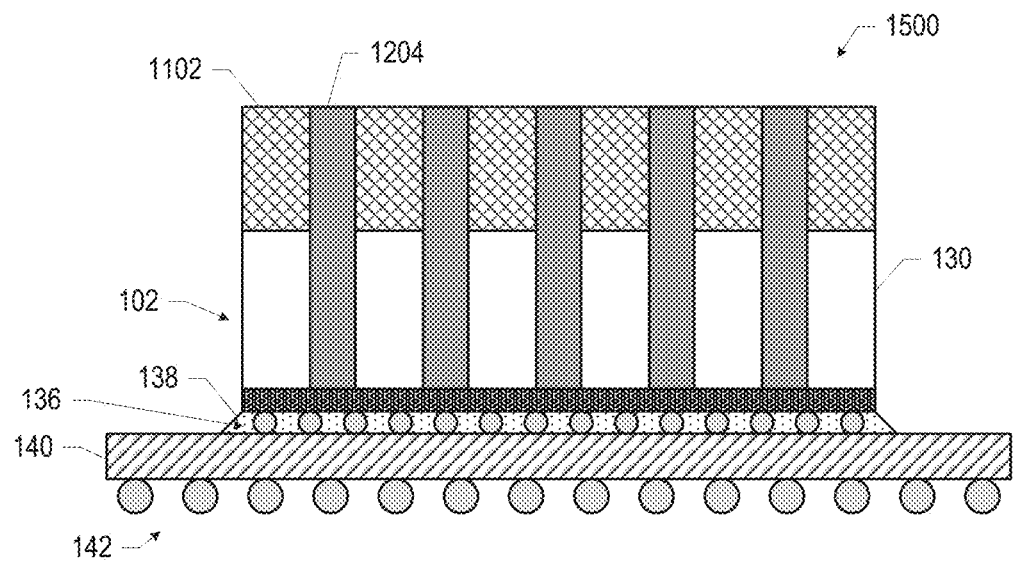

FIG. 15 illustrates an assembly 1500 subsequent to packaging the assembly 1400 by mounting the assembly 1400 to the package substrate 140 via the FLI 136. The assembly 1500 may include underfill 138 and SLI 142, as discussed above with reference to FIG. 2. In the embodiment of FIG. 15, during packaging, the photoresist 1102 may still surround the portions of the conductive material 1204 that extend from the die 102. The photoresist 1102 may provide mechanical protection to the conductive material 1204 during the handling required for packaging, and thus may advantageously be kept in place until it must be removed.

Figure 16:
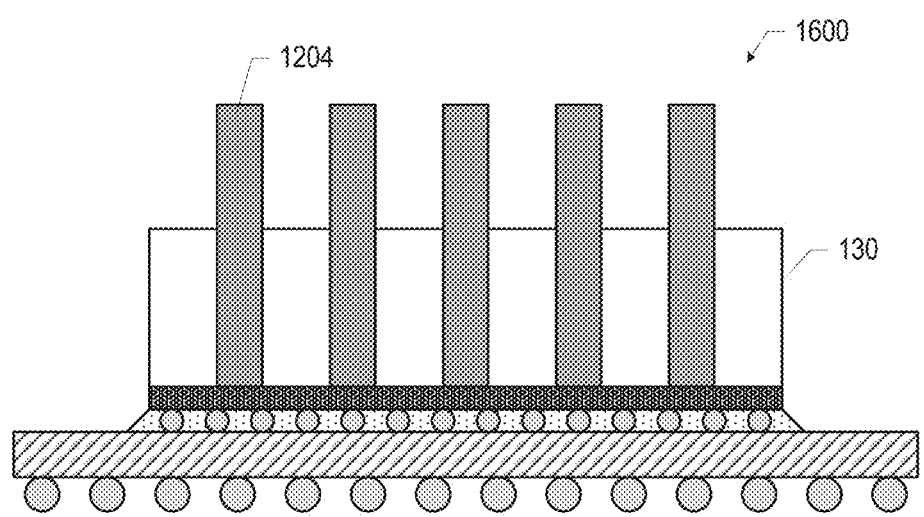

FIG. 16 illustrates an assembly 1600 subsequent to removing the photoresist 1102 from the assembly 1500 to expose the conductive material 1204 extending from the IC substrate 130. A conventional chemical process may be used to remove the photoresist 1102, but the particular parameters of the removal may be tuned so that the removal is gentle enough not to compromise the conductive material 1204.

Figure 17:
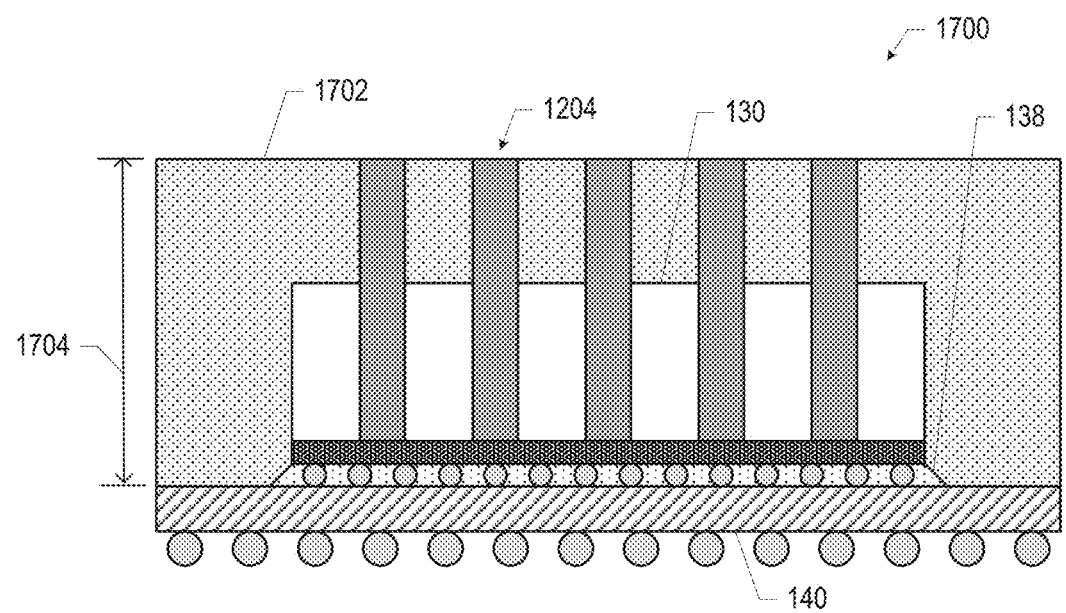

FIG. 17 illustrates an assembly 1700 subsequent to providing a mold compound 1702 on the package substrate 140 and around the die 102, the underfill 138, and the conductive material 1204. Although the mold compound 1702 is illustrated in FIG. 17 as leaving the ends of the conductive material 1204 exposed, in some embodiments, the conductive material 1204 may be overmolded with the mold compound 1702 so as to fully cover the conductive material 1204. The mold compound 1702 may have a thickness 1704, as measured from the surface of the package substrate 140.

Figure 18:
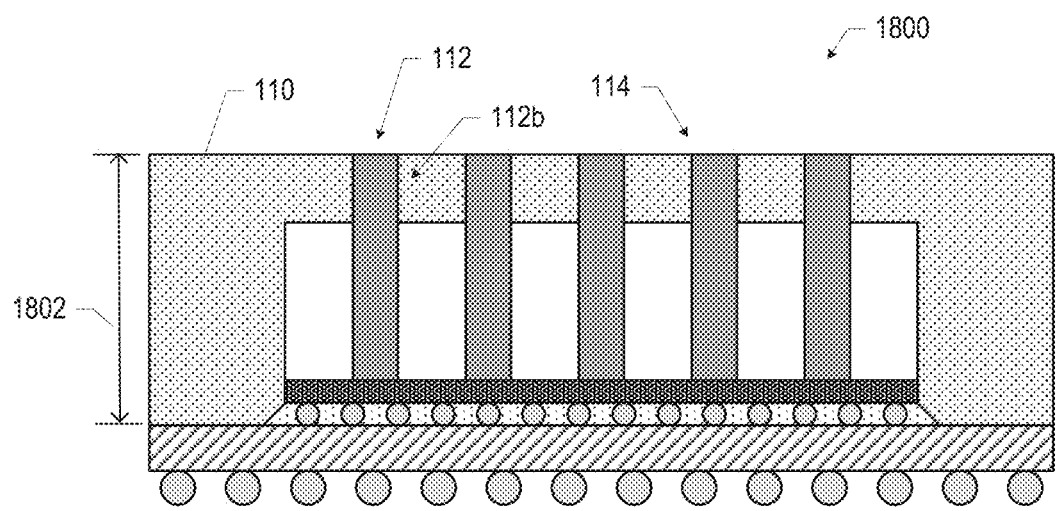

FIG. 18 illustrates an assembly 1800 subsequent to thinning the mold compound 1702 (and the conductive material 1204) of the assembly 1700 to a thickness 1802 less than the thickness 1704. Thinning operations may include chemical and/or mechanical polishing (e.g., CMP). The resulting thinned mold compound 1702 may provide the mold compound 110 discussed above with reference to FIG. 1 (e.g., having a surface 114), and the resulting thinned conductive material 1204 may provide the second portions 112*b* of the conductive pathways 112 discussed above with reference to FIG. 1.

Figure 19:
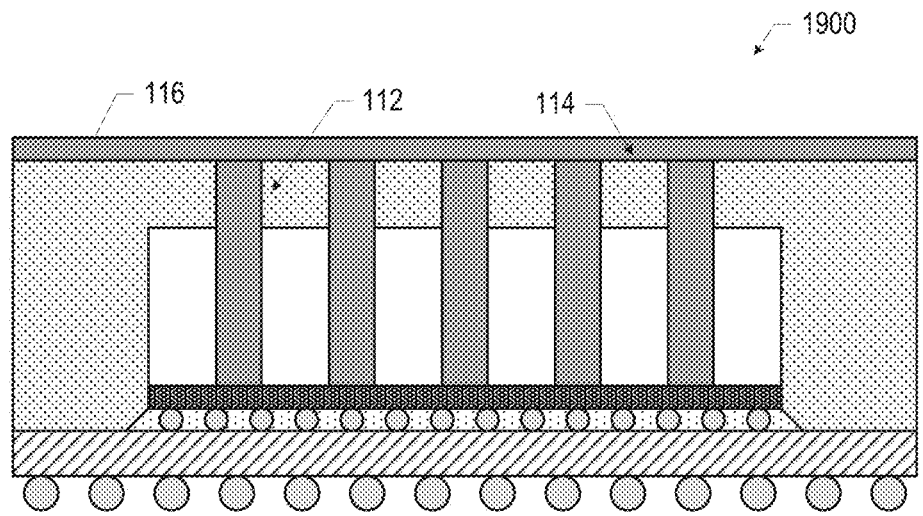

FIG. 19 illustrates an assembly 1900 subsequent to providing the package interconnect layer 116 on the surface 114 of the mold compound 110. In some embodiments, the package interconnect layer 116 may be formed using a photolithography process similar to that used on printed circuit boards. For example, a passivation layer (e.g., formed of some dielectric material) may be coated over the mold compound 110, a photoresist layer may be applied over the passivation layer, the photoresist layer may be exposed and developed to produce the desired pattern, the passivation layer may be patterned based on the patterned photoresist, the photoresist layer may be removed (leaving the patterned passivation layer), a copper layer or other conductive material layer may be coated over the passivation layer, and the package interconnect layer 116 may be finished by backgrinding the copper or other conductive material down to the level of the passivation layer. As discussed above, contact pads 120 and/or traces 122 may be in electrical contact with one or more of the conductive pathways 112.

Figure 20:
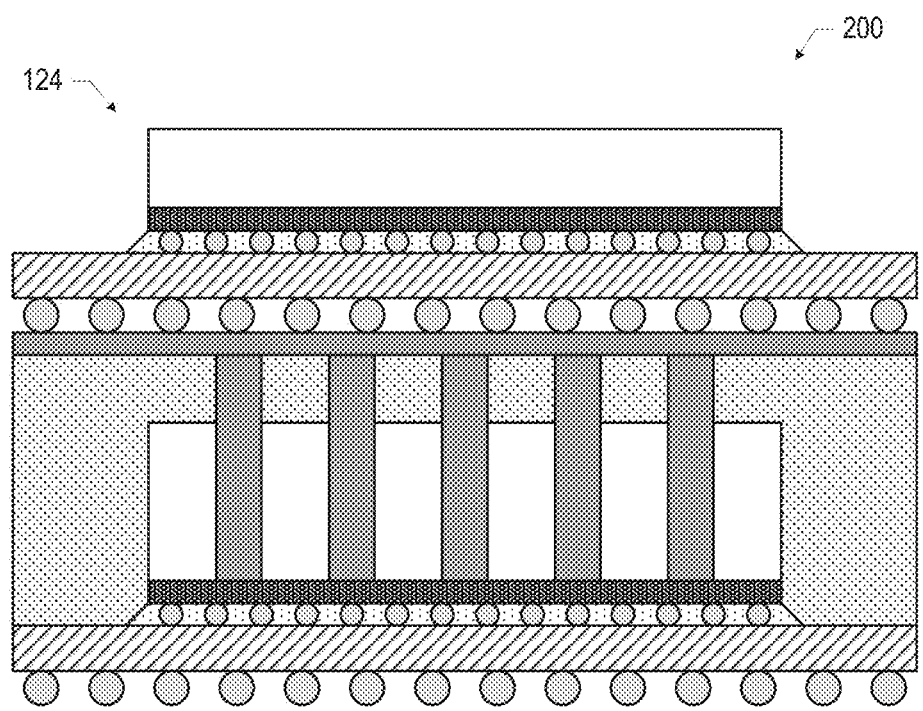

FIG. 20 illustrates the stacked IC structure 200, formed by securing an electronic component 124 to the package interconnect layer 116 of the assembly 1900. As discussed above with reference to FIG. 2, the electronic component 124 may be secured to the package interconnect layer 116 using any suitable mechanism (e.g., solder bonds, solder balls, or surface activated bonding). Subsequent processing operations (not shown) may include securing additional electronic components 124 to the package interconnect layer 116, securing additional electronic components 124 on "top" of the electronic component 124, or any of the other embodiments discussed herein.

Figure 21:
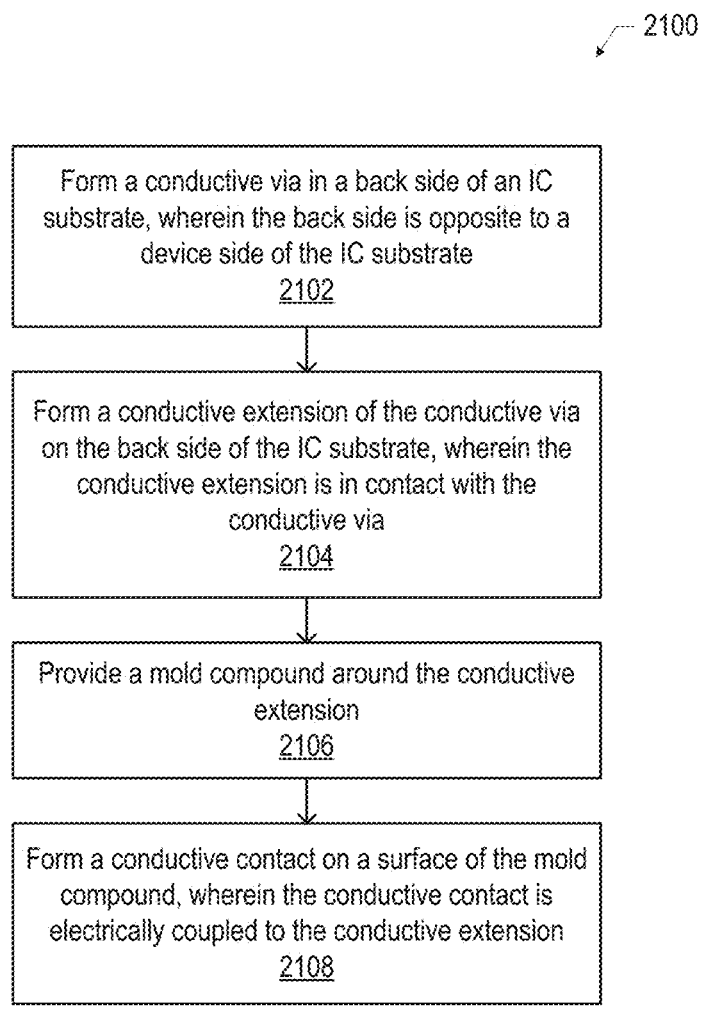
FIG. 21 is a flow diagram of a method of manufacturing an IC assembly, in accordance with various embodiments.

FIG. 21 is a flow diagram of a method 2100 of manufacturing an IC assembly, in accordance with various embodiments. Although the operations discussed below with reference to FIG. 21 are discussed in a particular order and once each, these operations may be performed multiple times (e.g., in parallel or in series) or in a different order, as appropriate. Additionally, although the operations discussed below with reference to FIG. 21 are illustrated by reference to various ones of the embodiments disclosed herein, the method 2100 may be used to manufacture any suitable IC assembly.

At 2102, a conductive via may be formed in the back side of an IC substrate. The back side of the IC substrate may be opposite to a device side of the IC substrate. For example, the first portion 112*a* of a conductive pathway 112 may be formed in the back side 106 of the IC substrate 130.

At 2104, a conductive extension of the conductive via of 2102 may be formed on the back side of the IC substrate. The conductive extension may be in contact with the conductive via. For example, the second portion 112*b* of a conductive pathway 112 may be provided in contact with the first portion 112*a* on the back side 106 of the IC substrate 130.

At 2106, a mold compound may be provided around the conductive extension of 2104. For example, the mold compound 110 may be provided around the second portion 112*b*.

At 2108, a conductive contact may be formed on a surface of the mold compound. The conductive contact may be electrically coupled to the conductive extension. For example, a contact pad 120 may be formed on the surface 114 of the mold compound 110, and may be in electrical contact with the second portion 112*b* of the conductive pathway 112.

The double-sided IC structures 100 disclosed herein may be included in any suitable electronic device. FIGS. 22-25 illustrate various examples of apparatuses that may be included in, or that may include, one or more of any of the double-sided IC structures 100 disclosed herein.

FIGS. 22A-B are top views of a wafer 2200 and dies 2202 that may take the form of any of the embodiments of the double-sided IC structures 100 disclosed herein. The wafer 2200 may be composed of semiconductor material and may include one or more dies 2202 having IC elements formed on a surface of the wafer 2200. Each of the dies 2202 may be a repeating unit of a semiconductor product that includes any suitable IC. After the fabrication of the semiconductor product is complete, the wafer 2200 may undergo a singulation process (e.g., as discussed above with reference to FIG. 14) in which each of the dies 2202 is separated from one another to provide discrete "chips" of the semiconductor product. The die 2202 may include one or more transistors (e.g., some of the transistors 2340 of FIG. 23, discussed below) and/or supporting circuitry to route electrical signals to the transistors, as well as any other IC components. The die 2202 may include one or more first portions 112*a* of conductive pathways 112, as discussed above with reference to FIGS. 7-14, and thus the die 2202 may be part of a double-sided IC structure 100. In some embodiments, the wafer 2200 or the die 2202 may include a memory device (e.g., a static random access memory (SRAM) device), a logic device (e.g., an AND, OR, NAND, or NOR gate), or any other suitable circuit element. Multiple ones of these devices may be combined on a single die 2202. For example, a memory array formed by multiple memory devices may be formed on a same die 2202 as a processing device (e.g., the processing device 2502 of FIG. 25) or other logic that is configured to store information in the memory devices or execute instructions stored in the memory array.

FIG. 23 is a cross-sectional side view of an IC device 2300 that may be used with any of the embodiments of the double-sided IC structures 100 disclosed herein. In particular, one or more of the IC devices 2300 may be included in one or more dies 102. The IC device 2300 may be formed on a substrate 2302 (e.g., the wafer 2200 of FIG. 22A) and may be included in a die (e.g., the die 2202 of FIG. 22B). In some embodiments, the substrate 2302 may provide the IC substrate 130. The substrate 2302 may be a semiconductor substrate composed of semiconductor material systems including, for example, N-type or P-type materials systems. The substrate 2302 may include, for example, a crystalline substrate formed using a bulk silicon or a silicon-on-insulator substructure. In some embodiments, the substrate 2302 may be formed using alternative materials, which may or may not be combined with silicon, that include but are not limited to germanium, indium antimonide, lead telluride, indium arsenide, indium phosphide, gallium arsenide, or gallium antimonide. Further materials classified as group II-VI, III-V, or IV may also be used to form the substrate 2302. Although a few examples of materials from which the substrate 2302 may be formed are described here, any material that may serve as a foundation for an IC device 2300 may be used. The substrate 2302 may be part of a singulated die (e.g., the dies 2202 of FIG. 22B) or a wafer (e.g., the wafer 2200 of FIG. 22A).

The IC device 2300 may include one or more device layers 2304 disposed on the substrate 2302. The device layer 2304 may be included in the circuitry 108 at the device side 104 of the die 102 of the double-sided IC structures 100. The device layer 2304 may include features of one or more transistors 2340 (e.g., metal oxide semiconductor field-effect transistors (MOSFETs)) formed on the substrate 2302. The device layer 2304 may include, for example, one or more source and/or drain (S/D) regions 2320, a gate 2322 to control current flow in the transistors 2340 between the S/D regions 2320, and one or more S/D contacts 2324 to route electrical signals to/from the S/D regions 2320. The transistors 2340 may include additional features not depicted for the sake of clarity, such as device isolation regions, gate contacts, and the like. The transistors 2340 are not limited to the type and configuration depicted in FIG. 23 and may include a wide variety of other types and configurations such as, for example, planar transistors, nonplanar transistors, or a combination of both. Nonplanar transistors may include FinFET transistors, such as double-gate transistors or tri-gate transistors, and wraparound or all-around gate transistors, such as nanoribbon and nanowire transistors.

Each transistor 2340 may include a gate 2322 formed of at least two layers, a gate dielectric layer and a gate electrode layer. The gate dielectric layer may include one layer or a stack of layers. The one or more layers may include silicon oxide, silicon dioxide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer may be formed on the gate dielectric layer and may include at least one P-type work-function metal or N-type work-function metal, depending on whether the transistor 2340 is to be a PMOS or an NMOS transistor. In some implementations, the gate electrode layer may consist of a stack of two or more metal layers, where one or more metal layers are work-function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, and conductive metal oxides (e.g., ruthenium oxide). For an NMOS transistor, metals that may be used for the gate electrode include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide).

In some embodiments, when viewed as a cross section of the transistor 2340 along the source-channel-drain direction, the gate electrode may consist of a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2320 may be formed within the substrate 2302 adjacent to the gate 2322 of each transistor 2340. The S/D regions 2320 may be formed using either an implantation/diffusion process or an etching/deposition process, for example. In the former process, dopants such as boron, aluminum, antimony, phosphorous, or arsenic may be ion-implanted into the substrate 2302 to form the S/D regions 2320. An annealing process that activates the dopants and causes them to diffuse farther into the substrate 2302 may follow the ion-implantation process. In the latter process, the substrate 2302 may first be etched to form recesses at the locations of the S/D regions 2320. An epitaxial deposition process may then be carried out to fill the recesses with material that is used to fabricate the S/D regions 2320. In some implementations, the S/D regions 2320 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2320 may be formed using one or more alternate semiconductor materials such as germanium or a group III-V material or alloy. In further embodiments, one or more layers of metal and/or metal alloys may be used to form the S/D regions 2320.

Electrical signals, such as power and/or input/output (I/O) signals, may be routed to and/or from the transistors 2340 of the device layer 2304 through one or more interconnect layers disposed on the device layer 2304 (illustrated in FIG. 23 as interconnect layers 2306-2310). For example, electrically conductive features of the device layer 2304 (e.g., the gate 2322 and the S/D contacts 2324) may be electrically coupled with the interconnect structures 2328 of the interconnect layers 2306-2310. The one or more interconnect layers 2306-2310 may form an interlayer dielectric (ILD) stack 2319 of the IC device 2300. The conductive pathways 112 of the double-sided IC structure 100 may extend to, and electrically couple to, one or more of the interconnect layers 2306-2310. The conductive pathways 112 may route signals to/from the devices in the device layer 2304, or may route signals through the interconnect layers 2306-2310 to/from other devices (e.g., other electronic components in a stacked IC structure 200, or other components sharing a circuit board with the IC device 2300).

The interconnect structures 2328 may be arranged within the interconnect layers 2306-2310 to route electrical signals according to a wide variety of designs (in particular, the arrangement is not limited to the particular configuration of interconnect structures 2328 depicted in FIG. 23). Although a particular number of interconnect layers 2306-2310 is depicted in FIG. 23, embodiments of the present disclosure include IC devices having more or fewer interconnect layers than depicted.

In some embodiments, the interconnect structures 2328 may include trench structures 2328a (sometimes referred to as "lines") and/or via structures 2328b (sometimes referred to as "holes") filled with an electrically conductive material such as a metal. The trench structures 2328a may be arranged to route electrical signals in a direction of a plane that is substantially parallel with a surface of the substrate 2302 upon which the device layer 2304 is formed. For example, the trench structures 2328a may route electrical signals in a direction in and out of the page from the perspective of FIG. 23. The via structures 2328b may be arranged to route electrical signals in a direction of a plane that is substantially perpendicular to the surface of the substrate 2302 upon which the device layer 2304 is formed. In some embodiments, the via structures 2328b may electrically couple trench structures 2328a of different interconnect layers 2306-2310 together.

The interconnect layers 2306-2310 may include a dielectric material 2326 disposed between the interconnect structures 2328, as shown in FIG. 23. In some embodiments, the dielectric material 2326 disposed between the interconnect structures 2328 in different ones of the interconnect layers 2306-2310 may have different compositions; in other embodiments, the composition of the dielectric material 2326 between different interconnect layers 2306-2310 may be the same.

A first interconnect layer 2306 (referred to as Metal 1 or "M1") may be formed directly on the device layer 2304. In some embodiments, the first interconnect layer 2306 may include trench structures 2328a and/or via structures 2328b, as shown. The trench structures 2328a of the first interconnect layer 2306 may be coupled with contacts (e.g., the S/D contacts 2324) of the device layer 2304.

A second interconnect layer 2308 (referred to as Metal 2 or "M2") may be formed directly on the first interconnect layer 2306. In some embodiments, the second interconnect layer 2308 may include via structures 2328b to couple the trench structures 2328a of the second interconnect layer 2308 with the trench structures 2328a of the first interconnect layer 2306. Although the trench structures 2328a and the via structures 2328b are structurally delineated with a line within each interconnect layer (e.g., within the second interconnect layer 2308) for the sake of clarity, the trench structures 2328a and the via structures 2328b may be structurally and/or materially contiguous (e.g., simultaneously filled during a dual-damascene process) in some embodiments.

A third interconnect layer 2310 (referred to as Metal 3 or "M3") (and additional interconnect layers, as desired) may be formed in succession on the second interconnect layer 2308 according to similar techniques and configurations described in connection with the second interconnect layer 2308 or the first interconnect layer 2306.

The IC device 2300 may include a solder resist material 2334 (e.g., polyimide or similar material) and one or more bond pads 2336 formed on the interconnect layers 2306-2310. The bond pads 2336 may provide the contacts to couple to the FLI 136, for example. The bond pads 2336 may be electrically coupled with the interconnect structures 2328 and configured to route the electrical signals of the transistor(s) 2340 to other external devices. For example, solder bonds may be formed on the one or more bond pads 2336 to mechanically and/or electrically couple a chip including the IC device 2300 with another component (e.g., a circuit board). The IC device 2300 may have other alternative configurations to route the electrical signals from the interconnect layers 2306-2310 than depicted in other embodiments. For example, the bond pads 2336 may be replaced by or may further include other analogous features (e.g., posts) that route the electrical signals to external components.

Figure 24:
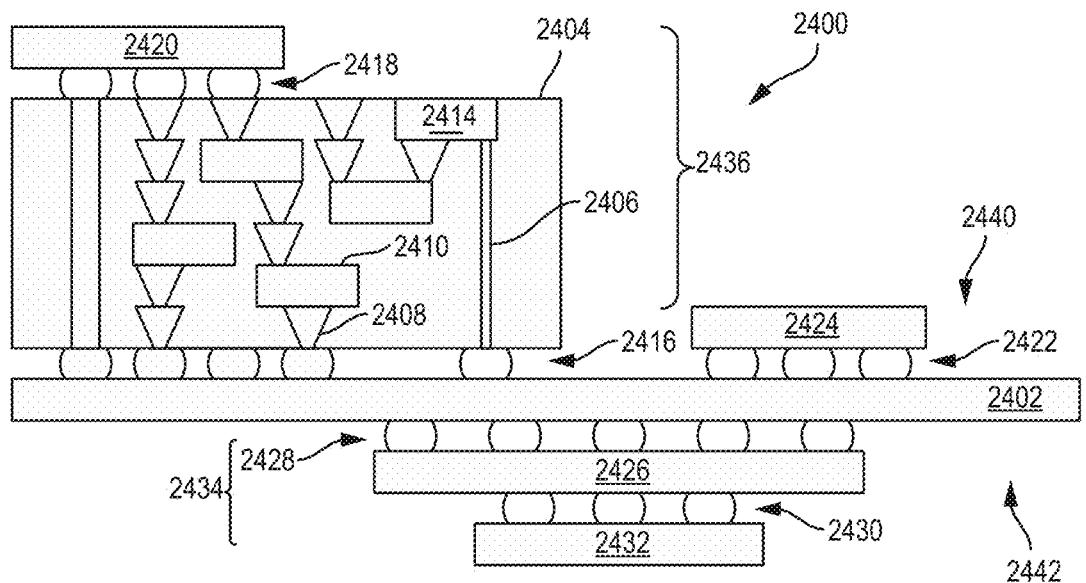
FIG. 24 is a cross-sectional side view of an IC device assembly that may include any of the embodiments of the double-sided IC structures disclosed herein.

FIG. 24 is a cross-sectional side view of an IC device assembly 2400 that may include any of the embodiments of the double-sided IC structures 100 disclosed herein. The IC device assembly 2400 includes a number of components disposed on a circuit board 2402 (which may be, e.g., a motherboard). The IC device assembly 2400 includes components disposed on a first face 2440 of the circuit board 2402 and an opposing second face 2442 of the circuit board 2402; generally, components may be disposed on one or both faces 2440 and 2442.

In some embodiments, the circuit board 2402 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2402. In other embodiments, the circuit board 2402 may be a non-PCB substrate.

The IC device assembly 2400 illustrated in FIG. 24 includes a package-on-interposer structure 2436 coupled to the first face 2440 of the circuit board 2402 by coupling components 2416. The coupling components 2416 may electrically and mechanically couple the package-on-interposer structure 2436 to the circuit board 2402, and may include solder balls (as shown in FIG. 24), male and female portions of a socket, an adhesive, an underfill material, and/or any other suitable electrical and/or mechanical coupling structure.

The package-on-interposer structure 2436 may include an electronics package 2420 coupled to an interposer 2404 by coupling components 2418. The coupling components 2418 may take any suitable form for the application, such as the forms discussed above with reference to the coupling components 2416. Although a single electronics package 2420 is shown in FIG. 24, multiple electronics packages may be coupled to the interposer 2404; indeed, additional interposers may be coupled to the interposer 2404. The interposer 2404 may provide an intervening substrate used to bridge the circuit board 2402 and the electronics package 2420. The electronics package 2420 may be or include, for example, a die (the die 2202 of FIG. 22B), an IC device (e.g., the IC device 2300 of FIG. 23), or any other suitable component. Generally, the interposer 2404 may spread a connection to a wider pitch or reroute a connection to a different connection. For example, the interposer 2404 may couple the electronics package 2420 (e.g., a die) to a ball grid array (BGA) of the coupling components 2416 for coupling to the circuit board 2402. In the embodiment illustrated in FIG. 24, the electronics package 2420 and the circuit board 2402 are attached to opposing sides of the interposer 2404; in other embodiments, the electronics package 2420 and the circuit board 2402 may be attached to a same side of the interposer 2404. In some embodiments, three or more components may be interconnected by way of the interposer 2404. In some embodiments, the electronics package 2420 may include a double-sided IC structure 100 (e.g., the electronics package 2420 may take the form of the double-sided package 202). For example, an additional electronic component may be disposed on the electronics package 2420 to form a stacked IC structure 200.

The interposer 2404 may be formed of an epoxy resin, a fiberglass-reinforced epoxy resin, a ceramic material, or a polymer material such as polyimide. In some embodiments, the interposer 2404 may be formed of alternate rigid or flexible materials that may include the same materials described above for use in a semiconductor substrate, such as silicon, germanium, and other group III-V and group IV materials. The interposer 2404 may include metal interconnects 2408 and vias 2410, including but not limited to through-silicon vias (TSVs) 2406. The interposer 2404 may further include embedded devices 2414, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 2404. The package-on-interposer structure 2436 may take the form of any of the package-on-interposer structures known in the art.

The IC device assembly 2400 may include an electronics package 2424 coupled to the first face 2440 of the circuit board 2402 by coupling components 2422. The coupling components 2422 may take the form of any of the embodiments discussed above with reference to the coupling components 2416, and the electronics package 2424 may take the form of any of the embodiments discussed above with reference to the electronics package 2420. In some embodiments, the electronics package 2424 may include a double-sided IC structure 100 (e.g., the electronics package 2424 may take the form of the double-sided package 202). For example, an additional electronic component may be disposed on the electronics package 2424 to form a stacked IC structure 200.

The IC device assembly 2400 illustrated in FIG. 24 includes a package-on-package structure 2434 coupled to the second face 2442 of the circuit board 2402 by coupling components 2428. The package-on-package structure 2434 may include an electronics package 2426 and an electronics package 2432 coupled together by coupling components 2430 such that the electronics package 2426 is disposed between the circuit board 2402 and the electronics package 2432. The package-on-package structure 2434 may take the form of the stacked IC structure 200 (e.g., the electronics package 2426 may be a double-sided package 202). The coupling components 2428 and 2430 may take the form of any of the embodiments of the coupling components 2416 discussed above, and the electronics packages 2426 and 2432 may take the form of any of the embodiments of the electronics package 2420 discussed above.

Figure 25:
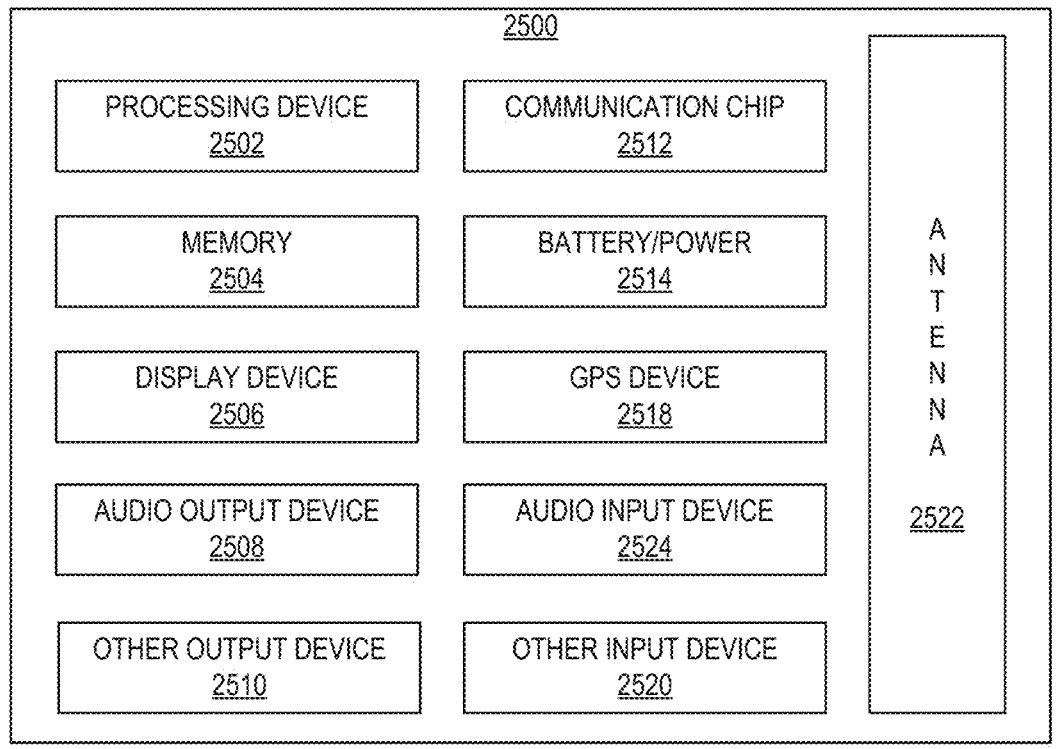
FIG. 25 is a block diagram of an example computing device that may include any of the embodiments of the double-sided IC structures disclosed herein.

FIG. 25 is a block diagram of an example computing device 2500 that may include one or more of any of the embodiments of the double-sided IC structures 100 disclosed herein. For example, any suitable ones of the components of the computing device 2500 may include, or be included in, a double-sided IC structure 100 (e.g., as the die 102) or a stacked IC structure 200 (e.g., as an electronic component 124) in accordance with any of the embodiments disclosed herein. A number of components are illustrated in FIG. 25 as included in the computing device 2500, but any one or more of these components may be omitted or duplicated, as suitable for the application. In some embodiments, some or all of the components included in the computing device 2500 may be attached to one or more motherboards. In some embodiments, some or all of these components are fabricated onto a single system-on-a-chip (SoC) die.

Additionally, in various embodiments, the computing device 2500 may not include one or more of the components illustrated in FIG. 25, but the computing device 2500 may include interface circuitry for coupling to the one or more components. For example, the computing device 2500 may not include a display device 2506, but may include display device interface circuitry (e.g., a connector and driver circuitry) to which a display device 2506 may be coupled. In another set of examples, the computing device 2500 may not include an audio input device 2524 or an audio output device 2508, but may include audio input or output device interface circuitry (e.g., connectors and supporting circuitry) to which an audio input device 2524 or audio output device 2508 may be coupled.

The computing device 2500 may include a processing device 2502 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2502 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2500 may include a memory 2504, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2504 may include memory that shares a die with the processing device 2502. This memory may be used as cache memory and may include embedded dynamic random access memory (eDRAM) or spin transfer torque magnetic random-access memory (STT-MRAM).

In some embodiments, the computing device 2500 may include a communication chip 2512 (e.g., one or more communication chips). For example, the communication chip 2512 may be configured for managing wireless communications for the transfer of data to and from the computing device 2500. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2512 may implement any of a number of wireless standards or protocols, including but not limited to Institute for Electrical and Electronic Engineers (IEEE) standards including Wi-Fi (IEEE 2302.11 family), IEEE 2302.16 standards (e.g., IEEE 2302.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 2302.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 2302.16 standards. The communication chip 2512 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2512 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2512 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2512 may operate in accordance with other wireless protocols in other embodiments. The computing device 2500 may include an antenna 2522 to facilitate wireless communications and/or to receive other wireless communications (such as AM or FM radio transmissions).

In some embodiments, the communication chip 2512 may manage wired communications, such as electrical, optical, or any other suitable communication protocols (e.g., the Ethernet). As noted above, the communication chip 2512 may include multiple communication chips. For instance, a first communication chip 2512 may be dedicated to shorter-range wireless communications such as Wi-Fi or Bluetooth, and a second communication chip 2512 may be dedicated to longer-range wireless communications such as GPS, EDGE, GPRS, CDMA, WiMAX, LTE, EV-DO, or others. In some embodiments, a first communication chip 2512 may be dedicated to wireless communications, and a second communication chip 2512 may be dedicated to wired communications.

The computing device 2500 may include battery/power circuitry 2514. The battery/power circuitry 2514 may include one or more energy storage devices (e.g., batteries or capacitors) and/or circuitry for coupling components of the computing device 2500 to an energy source separate from the computing device 2500 (e.g., AC line power).

The computing device 2500 may include a display device 2506 (or corresponding interface circuitry, as discussed above). The display device 2506 may include any visual indicators, such as a heads-up display, a computer monitor, a projector, a touchscreen display, a liquid crystal display (LCD), a light-emitting diode display, or a flat panel display, for example.

The computing device 2500 may include an audio output device 2508 (or corresponding interface circuitry, as discussed above). The audio output device 2508 may include any device that generates an audible indicator, such as speakers, headsets, or earbuds, for example.

The computing device 2500 may include an audio input device 2524 (or corresponding interface circuitry, as discussed above). The audio input device 2524 may include any device that generates a signal representative of a sound, such as microphones, microphone arrays, or digital instruments (e.g., instruments having a musical instrument digital interface (MIDI) output).

The computing device 2500 may include a global positioning system (GPS) device 2518 (or corresponding interface circuitry, as discussed above). The GPS device 2518 may be in communication with a satellite-based system and may receive a location of the computing device 2500, as known in the art.

The computing device 2500 may include an other output device 2510 (or corresponding interface circuitry, as discussed above). Examples of the other output device 2510 may include an audio codec, a video codec, a printer, a wired or wireless transmitter for providing information to other devices, or an additional storage device.

The computing device 2500 may include an other input device 2520 (or corresponding interface circuitry, as discussed above). Examples of the other input device 2520 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2500 may have any desired form factor, such as a hand-held or mobile computing device (e.g., a cell phone, a smart phone, a mobile internet device, a music player, a tablet computer, a laptop computer, a netbook computer, an ultrabook computer, a personal digital assistant (PDA), an ultra-mobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2500 may be any other electronic device that processes data.

The following paragraphs provide various examples of the embodiments disclosed herein.

Example 1 is an integrated circuit (IC) structure, including: a die having a device side and an opposing back side; a mold compound disposed at the back side; and a conductive pathway extending into the die from the back side and extending into the mold compound from the back side.

Example 2 may include the subject matter of Example 1, and may further specify that the mold compound has a surface spaced away from the back side such that the back side is disposed between the surface and the device side, and wherein the conductive pathway extends to the surface.

Example 3 may include the subject matter of Example 2, and may further include a package interconnect layer disposed at the surface, wherein the conductive pathway contacts the package interconnect layer at the surface.

Example 4 may include the subject matter of Example 3, and may further specify that the package interconnect layer includes a first contact pad disposed in a footprint of the die and a second contact pad disposed outside the footprint of the die, and the IC structure further includes an electronic component disposed on the package interconnect layer and in conductive contact with the first contact pad and the second contact pad.

Example 5 may include the subject matter of Example 4, and may further specify that the electronic component is in conductive contact with the first contact pad and the second contact pad via solder bumps, solder balls, or surface activated bonding.

Example 6 may include the subject matter of any of Examples 3-5, and may further specify that the package interconnect layer includes contact pads positioned to align with power and ground pads of an electronic component disposed on the package interconnect layer.

Example 7 may include the subject matter of any of Examples 3-6, and may further specify that the package interconnect layer includes multiple contact pads having a pitch greater than 30 microns, and the IC structure further includes an electronic component disposed on the package interconnect layer and in conductive contact with the multiple contact pads.

Example 8 may include the subject matter of any of Examples 2-7, and may further specify that a distance between the surface and the back side is greater than a thickness of the die.

Example 9 may include the subject matter of any of Examples 1-8, and may further specify that the conductive pathway includes a first portion in the die and a second portion in the mold compound, and the second portion is wider than the first portion.

Example 10 may include the subject matter of any of Examples 1-9, and may further specify that the die includes a semiconductor substrate having a front surface and an opposing back surface, the back surface of the substrate provides the back side of the die, and the conductive pathway extends into the die from the back surface to the front surface.

Example 11 may include the subject matter of Example 10, and may further specify that the semiconductor substrate is a portion of a silicon wafer.

Example 12 may include the subject matter of any of Examples 1-11, and may further specify that the conductive pathway contacts a metallization layer of the die at the device side of the die.

Example 13 may include the subject matter of any of Examples 1-12, and may further include: a package substrate; and first-level interconnects coupling the device side of the die to the package substrate.

Example 14 is a stacked integrated circuit (IC) structure, including: a die having a device side and an opposing back side; a mold compound disposed at the back side, wherein the mold compound has a surface spaced away from the back side such that the back side is disposed between the surface and the device side; a package interconnect layer disposed at the surface, wherein package interconnect layer includes a first contact pad disposed in a footprint of the die and a second contact pad disposed outside the footprint of the die; at least one conductive pathway in contact with the first and second contact pads and extending into the die; and an electronic component disposed on the package interconnect layer and coupled to the first contact pad or the second contact pad.

Example 15 may include the subject matter of Example 14, and may further specify that the electronic component is coupled to the first and second contact pads.

Example 16 may include the subject matter of Example 14, and may further specify that the electronic component is coupled to the first contact pad and a different electronic component is coupled to the second contact pad.

Example 17 may include the subject matter of any of Examples 14-16, and may further specify that the electronic component is a first electronic component, and the stacked IC structure further includes a second electronic component disposed on the first electronic component such that the first electronic component is disposed between the second electronic component and the mold compound.

Example 18 may include the subject matter of any of Examples 14-17, and may further specify that the at least one conductive pathway includes a first portion through the mold compound and a second portion through a substrate of the die.

Example 19 may include the subject matter of any of Examples 14-18, and may further specify that the electronic component disposed on the package interconnect layer includes a second die coupled to a package substrate, the package substrate is disposed between the die and the package interconnect layer, and the package substrate is in contact with the first contact pad or the second contact pad.

Example 20 is a computing device, including: a circuit board; and a stacked integrated circuit (IC) structure coupled to the circuit board, wherein the stacked IC structure includes a die having a device side and an opposing back side, a mold compound disposed at the back side, wherein the mold compound has a surface spaced away from the back side such that the back side is disposed between the surface and the device side, a conductive pathway extending into the die from the back side and extending into the mold compound from the back side, a contact pad disposed at the surface and in conductive contact with the conductive pathway, and an electronic component disposed at the surface and conductively coupled to the contact pad.

Example 21 may include the subject matter of Example 20, and may further specify that a package substrate is disposed between the electronic component and the surface.

Example 22 may include the subject matter of any of Examples 20-21, and may further specify that the electronic component is a wearable display.

Example 23 may include the subject matter of any of Examples 20-22, and may further specify that the electronic component includes a radio chip.

Example 24 may include the subject matter of any of Examples 20-23, and may further specify that the electronic component includes a second die.

Example 25 is a method of manufacturing an integrated circuit (IC) assembly, including: forming a conductive via in a back side of an IC substrate, wherein the back side is opposite to a device side of the IC substrate; after forming the conductive via, forming a conductive extension of the conductive via on the back side of the IC substrate, wherein the conductive extension is in contact with the conductive via; providing a mold compound around the conductive extension; and forming a conductive contact on a surface of the mold compound, wherein the conductive contact is electrically coupled to the conductive extension.

Example 26 may include the subject matter of Example 25, and may further include, after forming the conductive via, and before forming the conductive extension, thinning the IC substrate.

Example 27 may include the subject matter of any of Examples 25-26, and may further specify that forming the conductive extension includes: providing and patterning a photoresist on the back side of the IC substrate, wherein the patterned photoresist includes an opening to the conductive via; and providing conductive material in the opening to form the conductive extension.

Example 28 may include the subject matter of Example 27, and may further include: after providing the conductive material in the opening, singulating the IC substrate; and after singulating the IC substrate, removing the photoresist; wherein the mold compound is provided after removing the photoresist.

Example 29 may include the subject matter of any of Examples 25-28, and may further specify that providing the mold compound comprises overmolding the conductive extension.

Example 30 may include the subject matter of any of Examples 25-29, and may further include, after providing the mold compound, and before forming the conductive contact, thinning the mold compound.

Example 31 may include the subject matter of any of Examples 25-30, and may further specify that the IC substrate is a wafer.

Example 32 may include the subject matter of any of Examples 25-31, and may further specify that the conductive extension extends away from the conductive via.

The invention claimed is:

1. An integrated circuit (IC) structure, comprising:
   a first component, including:
      a first die having a device side and an opposing back side,
      a dielectric material at the back side, and
      a conductive pathway extending into the first die from the back side and extending into the dielectric material from the back side; and
   a second component conductively coupled to the first component, wherein the second component includes a second die, and the conductive pathway is located in a volume between the second die and the first die.

2. The IC structure of claim 1, wherein the dielectric material has a surface spaced away from the back side such that the back side is between the surface and the device side, and wherein the conductive pathway extends at least to the surface.

3. The IC structure of claim 2, further comprising:
   an interconnect layer at the surface, wherein the conductive pathway contacts the interconnect layer.

4. The IC structure of claim 1, wherein the second component is conductively coupled to the first component via solder.

5. The IC structure of claim 1, wherein the second component is conductively coupled to the first component by direct bonding.

6. The IC structure of claim 1, wherein the first component includes:
   a first conductive contact structure in a footprint of the first die, and
   a second conductive contact structure, coplanar with the first conductive contact structure, outside the footprint of the die.

7. The IC structure of claim 6, wherein the second component is conductively coupled to the first conductive contact structure and the second conductive contact structure.

8. The IC structure of claim 6, wherein the second component is conductively coupled to the first conductive contact structure and a third component, different from the first component and the second component, is conductively coupled to the second conductive contact structure.

9. The IC structure of claim 3, wherein the interconnect layer includes multiple conductive contact structures having a pitch greater than 30 microns.

10. The IC structure of claim 2, wherein a distance between the surface and the back side is greater than a thickness of the die.

11. The IC structure of claim 1, wherein the dielectric material includes a mold compound.

12. The IC structure of claim 1, wherein the conductive pathway includes a first portion in the die and a second portion in the dielectric material, and the second portion is wider than the first portion.

13. The IC structure of claim 1, wherein the die includes a substrate having a front surface and an opposing back surface, the back surface of the substrate provides the back side of the die, and the conductive pathway extends into the die from the back surface to the front surface.

14. The IC structure of claim 1, further comprising:
    a package substrate; and
    first-level interconnects coupling the device side of the die to the package substrate.

15. The IC structure of claim 1, wherein the IC structure is part of a wearable computing device.

16. The IC structure of claim 4, wherein the solder is located in the volume between the second component and the die.

17. The IC structure of claim 5, wherein a direct bonding interface between the second component and the first component is located in the volume between the second component and the die.

18. The IC structure of claim 8, wherein the third component includes a die.

19. An integrated circuit (IC) structure, comprising:
    a first component, including:
       a first die having a device side and an opposing back side,
       a dielectric material at the back side, and
       a conductive pathway extending into the die from the back side and extending into the dielectric material from the back side,
       a first conductive contact structure in a footprint of the first die, wherein the first conductive contact structures includes at least part of the conductive pathway, and
       a second conductive contact structure, coplanar with the first conductive contact structure, outside the footprint of the die; and
    a second component conductively coupled to the first component, wherein the second component is conductively coupled to the first conductive contact structure and the second conductive contact structure, the second component includes a second die, and the first conductive contact structure is located in a volume between the first die and the second die.

20. An integrated circuit (IC) structure, comprising:
    a first component, including:
       a first die having a device side and an opposing back side,
       a dielectric material at the back side, and
       a conductive pathway extending into the first die from the back side and extending into the dielectric material from the back side;
    a second component conductively coupled to the conductive pathway of the first component, wherein the second component includes a second die;
    a third component, conductively coupled to the second component, wherein the second component is at least partially located in a volume between the second component and the first component;
a package substrate; and
first-level interconnects coupling the device side of the die to the package substrate.

* * * * *